(12) United States Patent
Frost et al.

(10) Patent No.: US 9,881,972 B2
(45) Date of Patent: Jan. 30, 2018

(54) ARRAY OF MEMORY CELLS AND METHODS OF FORMING AN ARRAY OF MEMORY CELLS

(71) Applicant: Micron Technology, Inc., Boise, ID (US)

(72) Inventors: Denzil S. Frost, Boise, ID (US); Tuman Earl Allen, III, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/159,984

(22) Filed: May 20, 2016

(65) Prior Publication Data
US 2017/0338280 A1   Nov. 23, 2017

(51) Int. Cl.
*H01L 27/24* (2006.01)
*H01L 23/528* (2006.01)
(Continued)

(52) U.S. Cl.
CPC ........ *H01L 27/2463* (2013.01); *H01L 23/528* (2013.01); *H01L 27/101* (2013.01);
(Continued)

(58) Field of Classification Search
CPC ............... H01L 27/2463; H01L 23/528; H01L 45/1233; H01L 45/1675; H01L 45/1608;
(Continued)

(56) References Cited

U.S. PATENT DOCUMENTS 6,472,335 B1 * 10/2002 Tsai .................. H01L 21/02118
                                                            257/E21.251
6,664,186 B1 * 12/2003 Callegari .............. C23C 16/403
                                                            257/E21.202
(Continued)

OTHER PUBLICATIONS

Legtenber et al., "Anisotrapic Reactive Ion Etching of Silicon Using SF6/O2/CHF3 Gas Mixtures", J. Electrochem. Soc. 1995 vol. 142, issue 6, 2020-2028.*

(Continued)

*Primary Examiner* — Tom Thomas
*Assistant Examiner* — Vincent Wall
(74) *Attorney, Agent, or Firm* — Wells St. John P.S.

(57) ABSTRACT

A method of forming an array of memory cells comprises forming an elevationally inner tier of memory cells comprising spaced inner tier lower first conductive lines, spaced inner tier upper second conductive lines, and programmable material of individual inner tier memory cells elevationally between the inner tier first lines and the inner tier second lines where such cross. First insulative material is formed laterally between the inner tier second lines to have respective elevationally outermost surfaces that are lower than elevationally outermost surfaces of immediately laterally-adjacent of the inner tier second lines. Second insulative material is formed over the first insulative material and laterally between the inner tier second lines. The second insulative material is of different composition from that of the first insulative material. An elevationally outer tier of memory cells is formed to comprise spaced (Continued)

outer tier lower first conductive lines, spaced outer tier upper second conductive lines, and programmable material of individual outer tier memory cells elevationally between the outer tier first lines and the outer tier second lines where such cross. Arrays of memory cells independent of method of manufacture are disclosed.

20 Claims, 10 Drawing Sheets

(51) Int. Cl.
*H01L 45/00* (2006.01)
*H01L 27/10* (2006.01)

(52) U.S. Cl.
CPC ...... *H01L 27/2481* (2013.01); *H01L 45/1233* (2013.01); *H01L 45/1608* (2013.01); *H01L 45/1675* (2013.01)

(58) Field of Classification Search
CPC ............. H01L 21/768; H01L 21/76834; H01L 21/76224; H01L 21/7682; H01L 27/11524; H01L 27/2481
See application file for complete search history.

(56) References Cited

U.S. PATENT DOCUMENTS

| | | | |
|---|---|---|---|
| 8,809,831 B2* | 8/2014 | Herner | H01L 45/148 257/5 |
| 2006/0268594 A1* | 11/2006 | Toda | G11C 13/0011 365/100 |
| 2010/0237042 A1* | 9/2010 | Nguyen | G11B 5/855 216/22 |
| 2015/0069630 A1* | 3/2015 | Sciarrillo | H01L 21/76895 257/776 |
| 2016/0049447 A1* | 2/2016 | Jung | H01L 27/2463 257/4 |

OTHER PUBLICATIONS

Raballand et al., "A model for Si, SiCH, SiO2, SiOCH, and porous SiOCH etch rate calculation in inductively coupled fluorocarbon plasma with a pulsed bias: Importance of the fluorocarbon layer", Journal of Applied Physics 102, 063306 2007, pp. 1-8.*
U.S. Appl. No. 14/998,194, filed Dec. 23, 2015, Bernhardt et al.

* cited by examiner

ARRAY OF MEMORY CELLS AND METHODS OF FORMING AN ARRAY OF MEMORY CELLS

TECHNICAL FIELD

Embodiments disclosed herein pertain to arrays of memory cells and to methods of forming an array of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells might be volatile, semi-volatile, or non-volatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell determines which of the states the programmable material is in, and the writing of information to the cell places the programmable material in a predetermined state. Some programmable materials retain a memory state in the absence of refresh, and thus may be incorporated into nonvolatile memory cells.

Arrays of memory cells may comprise a plurality of access lines at one elevation and a plurality of sense lines at another elevation, with at least programmable material there-between. Individual memory cells are written to or read from by application of suitable voltage and/or current to the respective crossing access line and sense line. Some arrays of memory cells include two or more elevationally stacked tiers or decks of memory cells, with each tier comprising a plurality of access lines at one elevation, a plurality of sense lines at another elevation, and at least programmable material there-between. The tiers or decks are typically fabricated separately and sequentially, one atop another. Fabrication of the tiers may include patterned etching of programmable material and of conductive material of an access line and/or a sense line. Insulative material is laterally between the access lines and laterally between the sense lines within the individual tiers. That insulative material that is laterally between and lower than elevationally outer lines of the elevationally inner tier may also be etched during the patterned etching of conductive material of the elevationally inner lines of the elevationally outer tier. This may lead to damage or destruction of memory cells within the inner tier. While the invention was primarily motivated in addressing such problem, it is in no way so limited.

DETAILED DESCRIPTION OF EXAMPLE EMBODIMENTS

Figure 1:
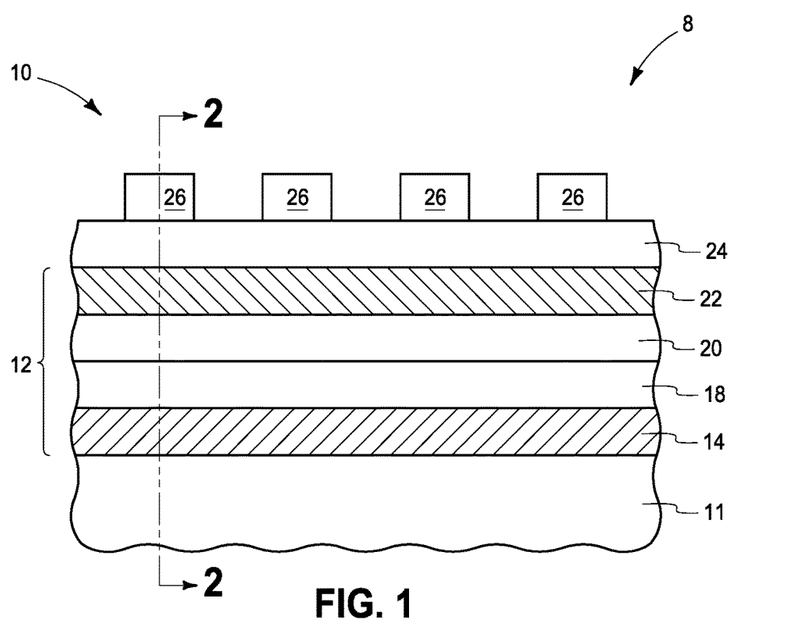
FIG. 1 is a diagrammatic sectional view of a substrate in process in accordance with an embodiment of the invention, and is taken through line 1-1 in FIG. 2.
Figure 2:
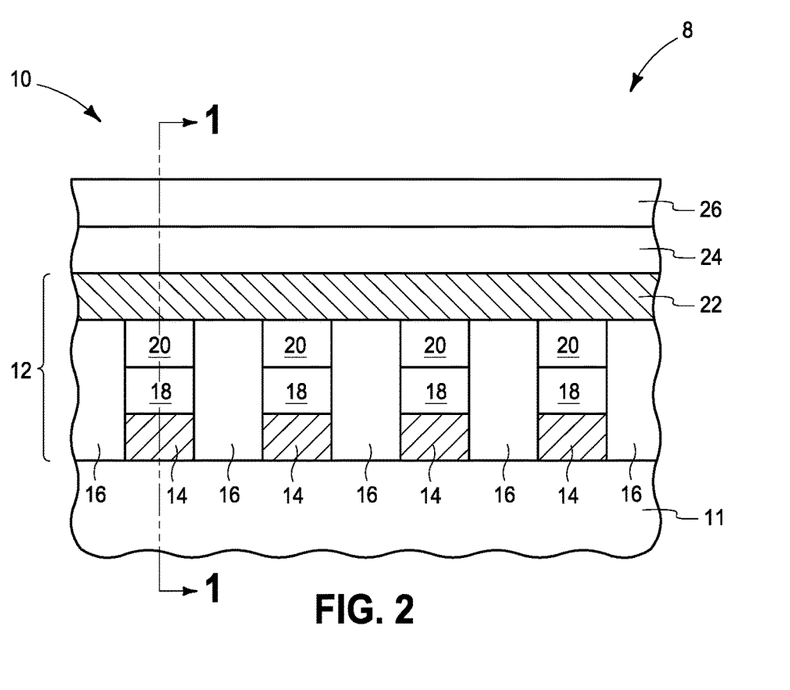
FIG. 2 is a view of the FIG. 1 substrate taken through line 2-2 in FIG. 1.

Embodiments of the invention encompass methods of forming an array of memory cells and arrays of memory cells independent of method of manufacture. Referring to FIGS. 1 and 2, an example fragment of a substrate construction 8 comprises an array or array area 10 that will comprise individual memory cells fabricated relative to a base substrate 11. Base substrate 11 may comprise any one or more of conductive/conductor/conducting (i.e., electrically herein), semiconductive, and insulative/insulator/insulating (i.e., electrically herein) materials. Various materials have been formed elevationally over base substrate 11. In this document, "elevational", "higher", "upper", "lower", "top", "atop", "bottom", "above", "below", "under", and "beneath" are generally with reference to the vertical direction. "Horizontal" refers to a general direction (i.e., within 10 degrees) along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Array 10 will comprise multiple (i.e., at least two) tiers or levels of memory cells. The discussion proceeds with reference to fabrication of an array of memory cells in two tiers, although more than two tiers may be fabricated. Regardless, such an array will comprise an elevationally inner tier of memory cells and an elevationally outer tier of memory cells, and which in one embodiment are immediately proximate one another (i.e., there being no other tier of memory cells between the elevationally inner and outer tiers in such one embodiment). FIGS. 1 and 2 show an elevationally inner tier 12 of materials in fabrication for an elevationally inner tier of memory cells. Such includes spaced inner tier lower first conductive lines 14 that have been fabricated over base substrate 11. Any suitable conductive material(s) may be used for inner tier lower first conductive lines 14, with elemental tungsten being one example. In one embodiment and as shown, select device material 18 is over inner tier lower first conductive lines 14. The select devices being formed may comprise any existing or yet-to-be-developed select devices, for example a junction device, a diode, an ovonic threshold switch, chalcogenide material(s), etc. Example diodes include PN diodes, PIN diodes, Schottky diodes, Zener diodes, avalanche diodes, tunnel diodes, diodes having more than three materials, etc. A select device need not be used. Inner tier programmable material 20 has been formed elevationally over and, in one embodiment, covers all of inner tier lower first conductive lines 14 within array area 10 of the memory cells being fabricated. Any suitable existing or yet-to-be-developed programmable materials may be used (e.g., resistance-variable, ferroelectric, chalcogenide, phase change, memristive, etc.). When select device material 18 is used, the relative positions of inner tier programmable material 20 and select device material 18 may be reversed.

Inner tier lower first conductive lines 14 may be formed by any suitable technique, for example subtractive photolithographic patterning and etch with or without using pitch multiplication. As an example, materials for any of the structures or materials designated with numerals 20, 18, and 14 may be blanketly deposited over base substrate 11 and then patterned together in a single masking step to form line-stacks of such materials (as shown). Insulative material 16 (FIG. 2) may then be deposited to overfill the spaces/trenches between the line stacks, followed by planarizing insulative material 16 back at least to the elevationally outermost surfaces of inner tier programmable material 20. Insulative material 16 may comprise any suitable insulative material, for example silicon dioxide and/or silicon nitride that may include phosphorus, boron, and/or other material(s). An alternate example is a carbon-based spin-on dielectric (CSOD) comprising 25% (atomic) or more carbon. Insulative material 16 may not be homogenous, for example comprising an initially-deposited insulative material lining (not shown; e.g., $SiO_2$ or $Si_3N_4$) followed by deposition of a subsequent fill material (e.g., CSOD).

Inner tier upper conductive material 22 has been formed over and, in one embodiment, covers all of inner tier programmable material 20 within array area 10. Inner tier upper conductive material 22 may be of the same or different composition(s) as that of the material of lines inner tier lower first conductive lines 14. Inner tier upper conductive material 22 will be used in fabrication of spaced inner tier upper second conductive lines, for example pursuant to the continuing discussion. Reference to "first" and "second" with respect to different components or materials herein is only for convenience of description in referring to different components, different materials, and/or same materials or components formed at different times. Accordingly and unless otherwise indicated, "first" and "second" may be interchanged independent of relative position within the finished circuit construction and independent of sequence in fabrication.

In one embodiment and as shown, sacrificial first masking material 24 has been formed elevationally over and covers all of inner tier upper conductive material 22 within array area 10. Patterned second sacrificial masking material 26 has been formed elevationally over first masking material 24. First and second masking materials 24, 26, respectively, may be of the same or different composition(s) relative one another. Patterned sacrificial second masking material 26 may be formed using any suitable existing or yet-to-be-developed technique with or without using pitch multiplication. Example materials include photoresist, multi-level resist, silicon dioxide, and silicon nitride, with in one specific embodiment sacrificial first masking material 24 comprising silicon nitride.

Figure 3:
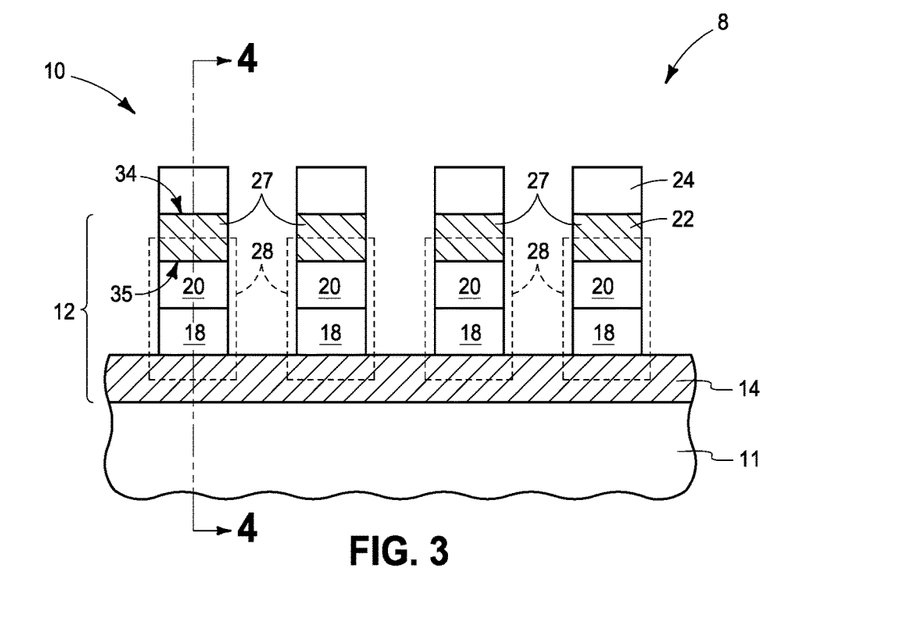
FIG. 3 is a view of the FIG. 1 substrate at a processing step subsequent to that shown by FIG. 1, and is taken through line 3-3 in FIG. 4.
Figure 4:
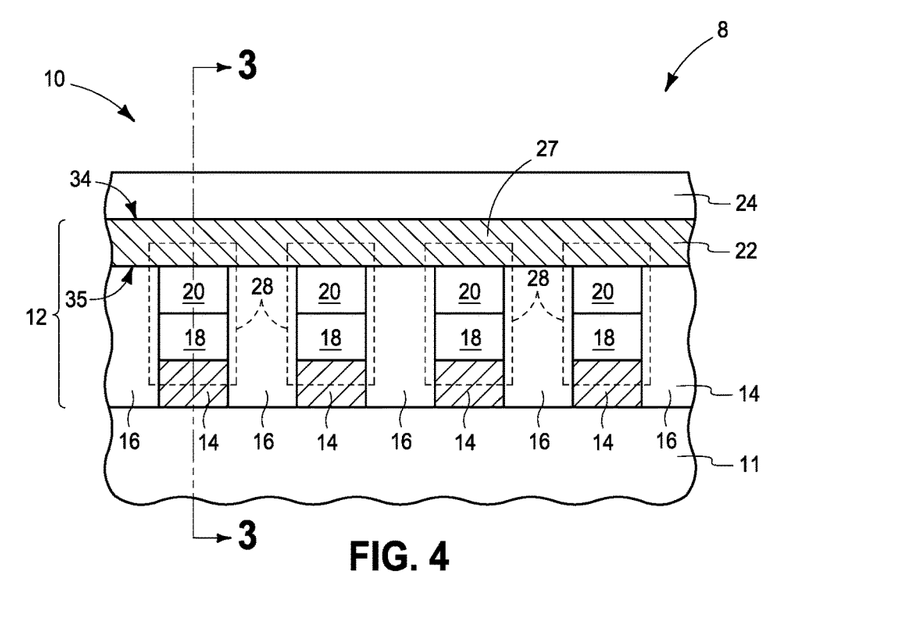
FIG. 4 is a view of the FIG. 3 substrate taken through line 4-4 in FIG. 3.

Referring to FIGS. 3 and 4, sacrificial first masking material 24 has been patterned using at least patterned second masking material 26 (not shown) as a mask. Such may be conducted, by way of example, using any suitable anisotropic etch, and wherein second masking material 26 (not shown) may be removed during, after, or remain (not shown) at conclusion of an etch conducted of first masking material 24. Regardless and as shown, inner tier conductive material 22, inner tier programmable material 20, and select device material 18 have been patterned using at least patterned sacrificial first masking material 24 as a mask. Such forms spaced inner tier upper second conductive lines 27 comprising inner tier upper conductive material 22 and forms inner tier programmable material 20 (and select device material 18 when present) of individual inner tier memory cells 28 elevationally between inner tier lower first conductive lines 14 and inner tier second lines 27 where such cross. Inner tier lower first conductive lines 14 can be either of access or sense lines, with inner tier second lines 27 being the other of access or sense lines. Inner tier lower first conductive lines 14 and upper second lines 27 are shown as being straight-linear and crossing orthogonally relative one another, although any other crossing relationship(s) or construction(s) may be used. Inner tier upper second lines 27 may be considered as individually having elevationally outermost and innermost surfaces 34 and 35, respectively. In one embodiment, such respective surfaces are planar, and in one embodiment are respectively coplanar although other configurations are of course contemplated.

The above example processing is but one example of a method of forming an elevationally inner tier of memory cells comprising spaced inner tier lower first conductive lines, spaced inner tier upper second conductive lines, and programmable material of individual inner tier memory cells elevationally between the inner tier first lines and the inner tier second lines where such cross. Any other existing or yet-to-be-developed methods may be used.

Figure 5:
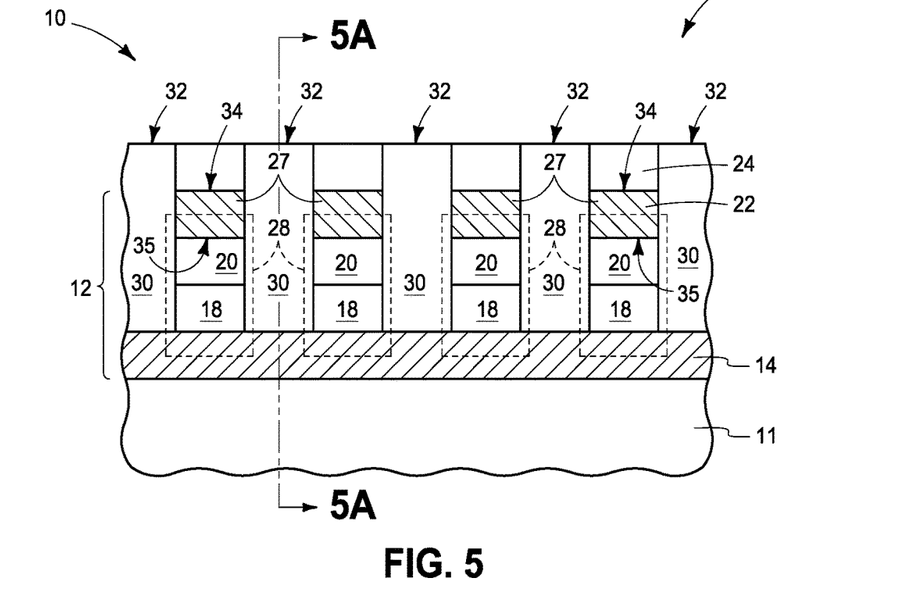
FIG. 5 is a view of the FIG. 3 substrate at a processing step subsequent to that shown by FIG. 3.
Figure 5A:
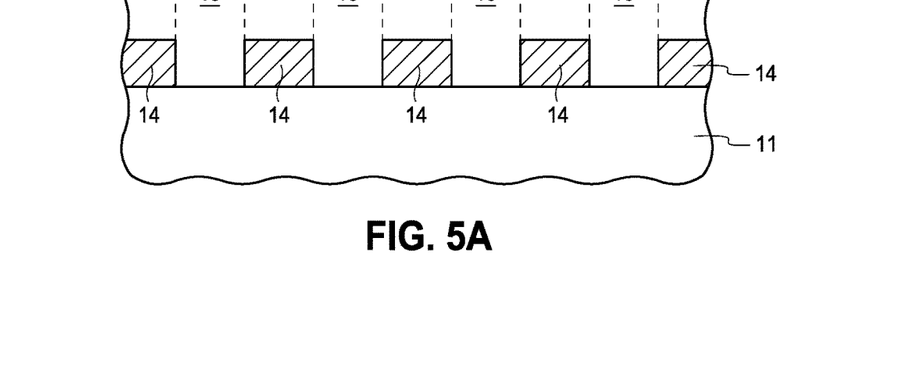
FIG. 5A is a view of the FIG. 5 substrate taken through line 5A-5A in FIG. 5.

Referring to FIGS. 5 and 5A, first insulative material 30 has been formed laterally between patterned inner tier select device material 18, inner tier programmable material 20, inner tier upper second lines 27, and first masking material 24. First insulative material 30 has elevationally outermost surfaces 32 that are higher than elevationally outermost surfaces 34 of immediately laterally adjacent inner tier upper second lines 27. First insulative material 30 may comprise any suitable insulative material, with in one ideal example predominantly comprising a CSOD as described above for insulative material 16. Further in one embodiment, first insulative material 30 may not be homogenous, for example comprising an initially-deposited insulative material lining (not shown) followed by deposition of a subsequent fill material (e.g., CSOD). In one embodiment, such a lining is inorganic (e.g., silicon dioxide and/or silicon nitride) and is devoid of carbon (i.e., less than 0.1 atomic percent carbon, if any), with the remainder of first insulative material 30 comprising CSOD. Regardless, an example technique for forming first insulative material 30 is initial deposition to over-fill the spaces between the depicted raised features of FIG. 3, followed by chemical mechanical polishing or other polishing or etch-back of material 30 at least to elevationally outermost surfaces of first sacrificial 24 to form the depicted FIG. 5 construction. Insulative materials 16 and 30 may be of the same composition and as is exemplified and shown by a dashed-line interface between contacting insulative materials 16 and 30 (FIG. 5A).

Figure 6:
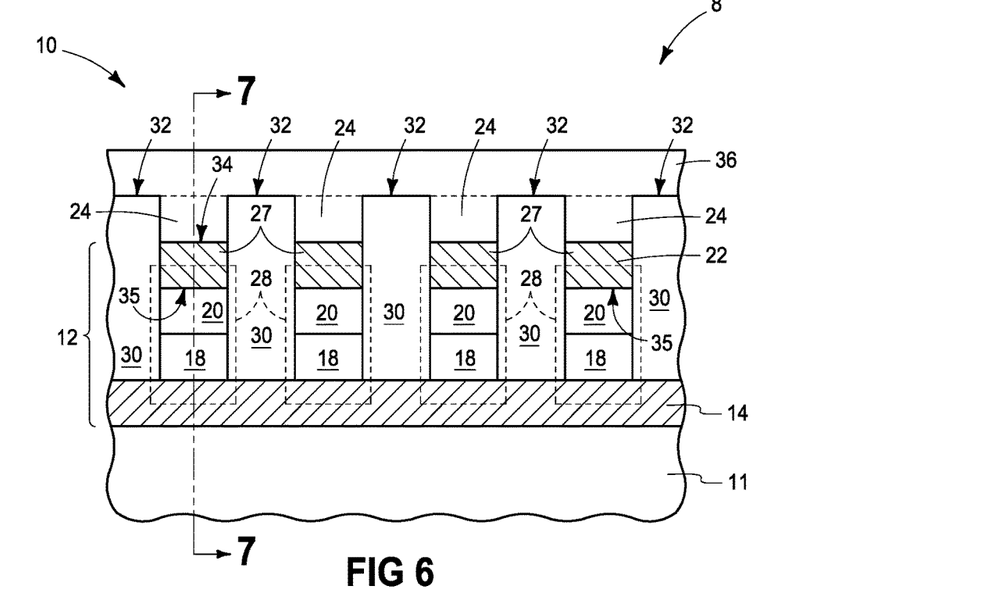
FIG. 6 is a view of the FIG. 5 substrate at a processing step subsequent to that shown by FIG. 5, and is taken through line 6-6 in FIG. 7.
Figure 7:
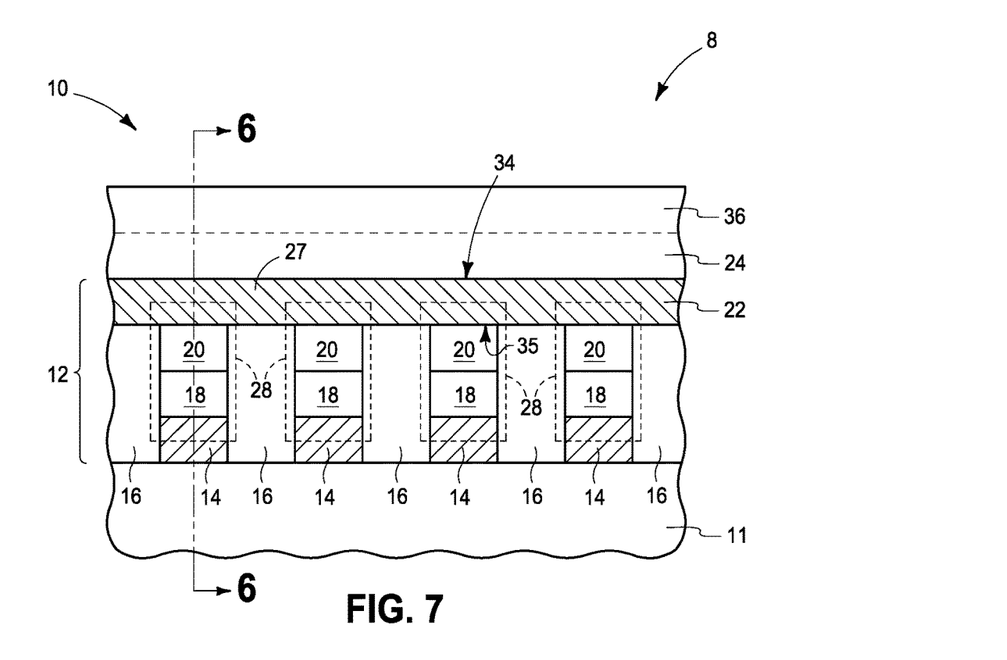
FIG. 7 is a view of the FIG. 6 substrate taken through line 7-7 in FIG. 6.

Referring to FIGS. 6 and 7, a sacrificial third masking material 36 has been formed elevationally over and covers all of patterned sacrificial first masking material 24 and first insulative material 30 within array area 10. Third masking material 36 may be of the same or different composition as that of first masking material 24. In one embodiment and as shown, third masking material 36 is of the same composition as first masking material 24 and is formed directly against first masking material 24 as exemplified by the dashed-line interface between materials 36 and 24. Example thicknesses for each of the materials for the structures or materials designated with numerals 14, 18, 20, 22, 24, and 26 are from about 200 Angstroms to about 600 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials ore regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Figure 8:
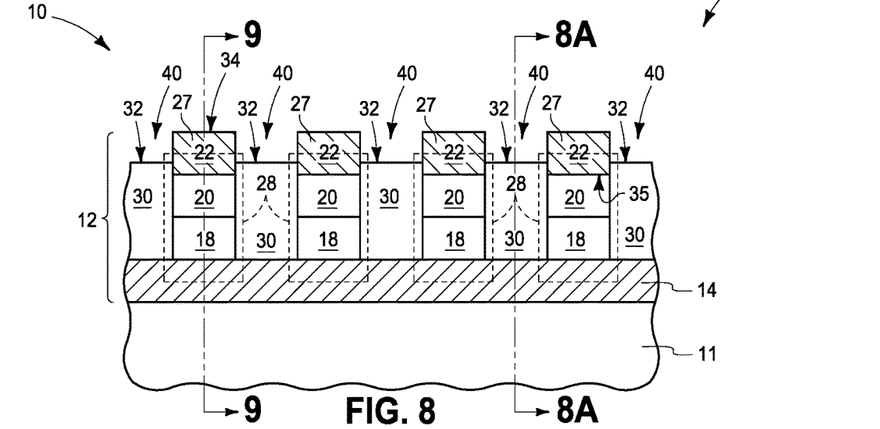
FIG. 8 is a view of the FIG. 6 substrate at a processing step subsequent to that shown by FIG. 6, and is taken through line 8-8 in FIG. 9.
Figure 8A:
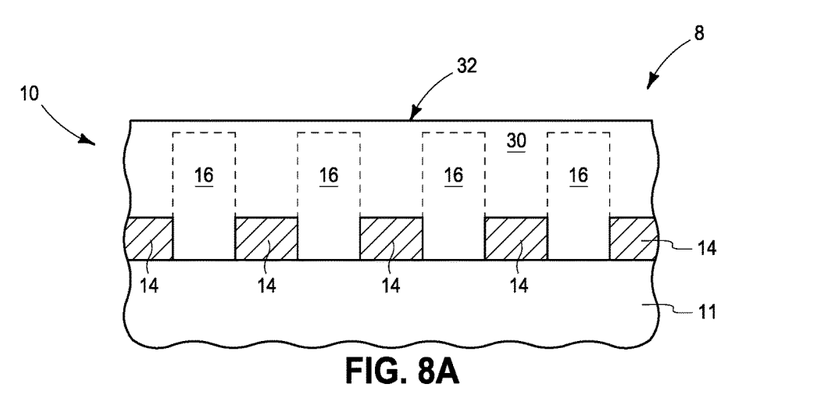
FIG. 8A is a view of the FIG. 8 substrate taken through line 8A-8A in FIG. 8.
Figure 9:
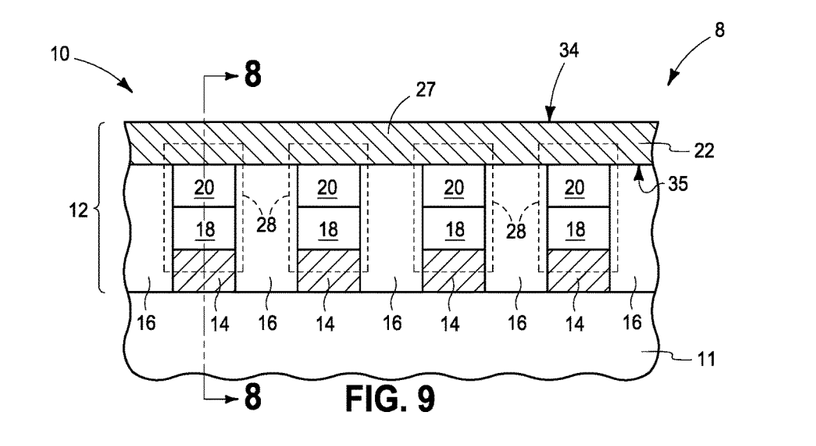
FIG. 9 is a view of the FIG. 8 substrate taken through line 9-9 in FIG. 8.

Referring to FIGS. 8, 8A, and 9, third masking material 36 (not shown), first masking material 24 (not shown), and first insulative material 30 have been etched to form a void space 40 (FIG. 8) atop first insulative material 30 laterally between immediately laterally-adjacent inner tier second lines 27. In one embodiment and as shown, the etching (i.e., including at least some chemically active etching component) of first insulative material 30 to form void spaces 40 is conducted selectively relative to inner tier second lines 27. In this document, a selective etch or removal is an etch or removal where one material is removed relative to another stated material at a rate of at least 2.0:1. Elevationally outermost surfaces 32 of first insulative material 30 are between immediately adjacent second lines 27 below elevationally outermost surfaces 34 thereof. In one embodiment, surfaces 34 and 32 are planar, and in one embodiment are respectively coplanar. Regardless, in one embodiment and as shown, elevationally outermost surfaces 32 of insulative material 30 are elevationally outward of elevationally innermost surfaces 35 of individual second lines 27.

The above example-described processing is but one example technique of forming first insulative material 30 laterally between inner tier upper second lines 27 (e.g., regardless of whether laterally between material there-below) to have respective elevationally outermost surfaces (e.g., 32) that are lower than elevationally outermost surfaces (e.g., 34) of immediately laterally-adjacent inner tier second lines 27 (e.g., regardless of whether elevationally outward of elevationally innermost surfaces 35). In one such embodiment, forming of elevationally outermost surfaces 32 of first insulative material 30 comprises forming first insulative material 30 laterally between inner tier upper second lines 27 to initially project elevationally outward relative to elevationally outermost surfaces 34 of immediately laterally-adjacent inner tier second lines 27 (e.g., FIG. 5). In one such embodiment, etching (i.e., including at least some chemically active etching component) is then conducted of the elevationally projecting first insulative material 30 to be everywhere elevationally inward of the elevationally outermost surfaces of the immediately laterally-adjacent inner tier second lines 27 (e.g., as shown in FIG. 8). In one such embodiment, the etching of such first insulative material 30 is conducted selectively relative to inner tier second lines 27.

In one embodiment, first insulative material 30 is laterally between inner tier second lines 27 (e.g., regardless of whether being laterally between material of laterally-spaced constructions there-below). Sacrificial material is formed elevationally to cover over all of inner tier second lines 27 and first insulative material 30, for example sacrificial materials 24 and 36 regardless of whether such are of the same or different composition(s) relative one another. Etching is conducted of the sacrificial material to expose the first insulative material and the inner tier second lines. In such embodiment, etching is also conducted of the first insulative material selectively relative to the inner tier second lines to form a void space atop the first insulative material laterally between immediately adjacent of the second tier second lines, for example as shown and described above in but one embodiment with respect to the processing shown by FIGS. 8 and 9.

In one embodiment, the etchings are conducted in situ in the same etching chamber (i.e., without removing the substrate being processed from the etching chamber between etchings) using the same chemically active etching components in each of such etchings. In one such embodiment, lower chamber pressure is used when conducting at least a majority of the etching of the first insulating material in comparison to when conducting at least a majority of the etching of the sacrificial material. In one embodiment, reduced volumetric flow rate of at least one of the chemically active etching components is used when conducting at least a majority of the etching of the first insulative material in comparison to when conducting at least a majority of the etching of the sacrificial material. In one embodiment, the etchings each comprise plasma etching within a plasma etching chamber. In one such embodiment, reduced plasma-generating power is used when conducting at least a majority of the etching of the first insulating material in comparison to when conducting at least a majority of the etching of the sacrificial material.

For example, and as but one specific example, the sacrificial material may comprise silicon nitride and the first insulative material may comprise solidified CSOD comprising a combination of silicon, oxygen, and carbon. The etching of the sacrificial material and of the first insulative material may be conducted in situ in the same plasma etching chamber. Plasma etching of the silicon nitride-comprising sacrificial material may be conducted using a first source power (e.g., 1000 Watts), a first chamber pressure (e.g., 45 mTorr), a first flow rate of a hydrogen halide (e.g., HBr at 20 sccm), a first flow rate of a fluorocarbon (e.g., $CF_4$ at 300 sccm), and a first flow rate of a hydrofluorocarbon (e.g., $CH_2F_2$ at 40 sccm), and 200 Volts bias. Towards or at the anticipated end of etching of the silicon nitride sacrificial material, the CSOD first insulative material may be plasma etched in situ using a second source power that is less than the first source power (e.g., at 500 Watts instead of 1000 Watts), a second chamber pressure less than the first chamber pressure (e.g., at 25 mTorr instead of 45 mTorr), the first flow rate of the hydrogen halide, the first flow rate of the hydrofluorocarbon, and a second flow rate of the fluorocarbon that is less than the first flow rate of the fluorocarbon (e.g., at 180 sccm instead of at 300 sccm). Changing such parameters may increase selectivity in etching silicon nitride selectively relative to tungsten (if material 22 comprises elemental tungsten) if such etch selectivity is desired.

In one embodiment, formation of the sacrificial material is conducted in two separate time-spaced deposition steps (e.g., as described above for sacrificial materials 24 and 36), with in one such embodiment each of the two separate deposition steps forming the sacrificial material to be of the same composition relative each other.

Figure 10:
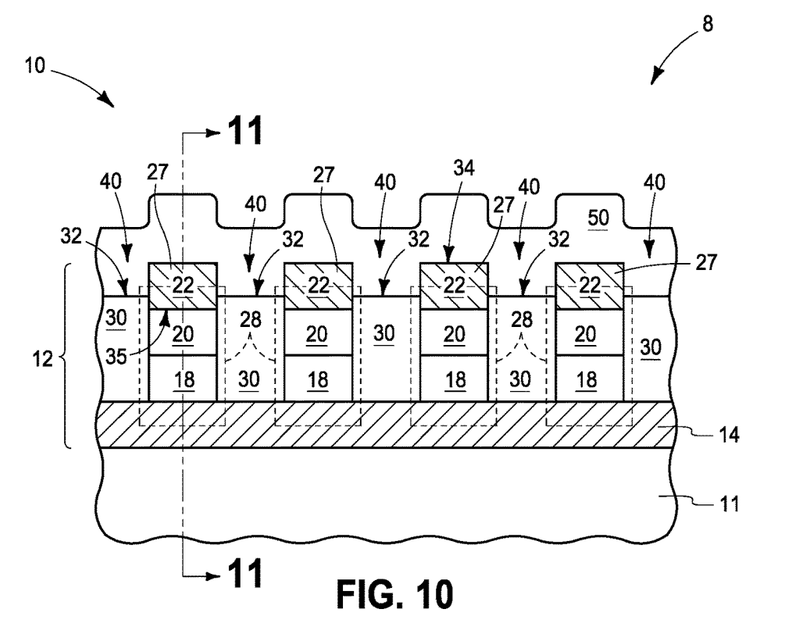
FIG. 10 is a view of the FIG. 8 substrate at a processing step subsequent to that shown by FIG. 8, and is taken through line 10-10 in FIG. 11.
Figure 11:
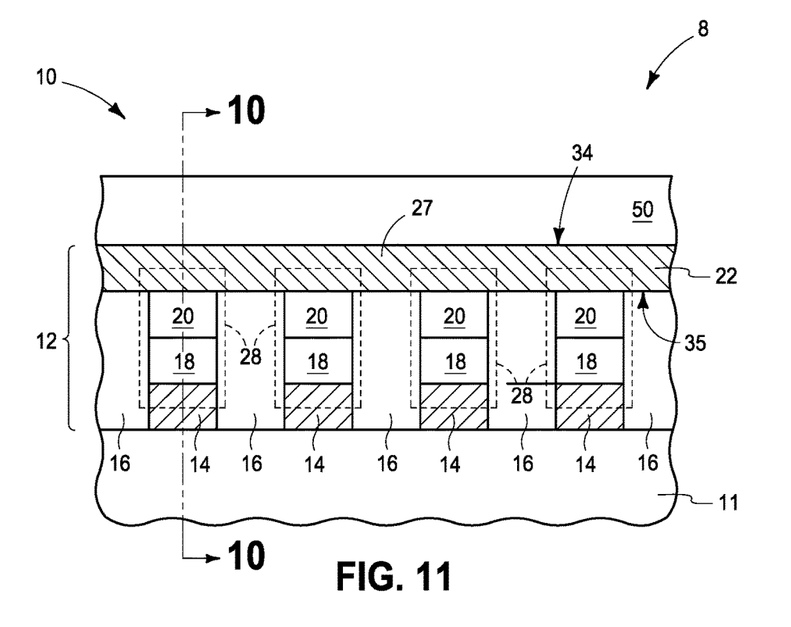
FIG. 11 is a view of the FIG. 10 substrate taken through line 11-11 in FIG. 10.

Referring to FIGS. 10 and 11, second insulative material 50 has been formed within void spaces 40 to be elevationally over, and in one embodiment directly against, first insulative material 30 and laterally between inner tier upper second lines 27. Second insulative material 50 is of different composition from that of first insulative material 30, for example silicon nitride and/or silicon dioxide when material 30 predominantly comprises CSOD.

Figure 12:
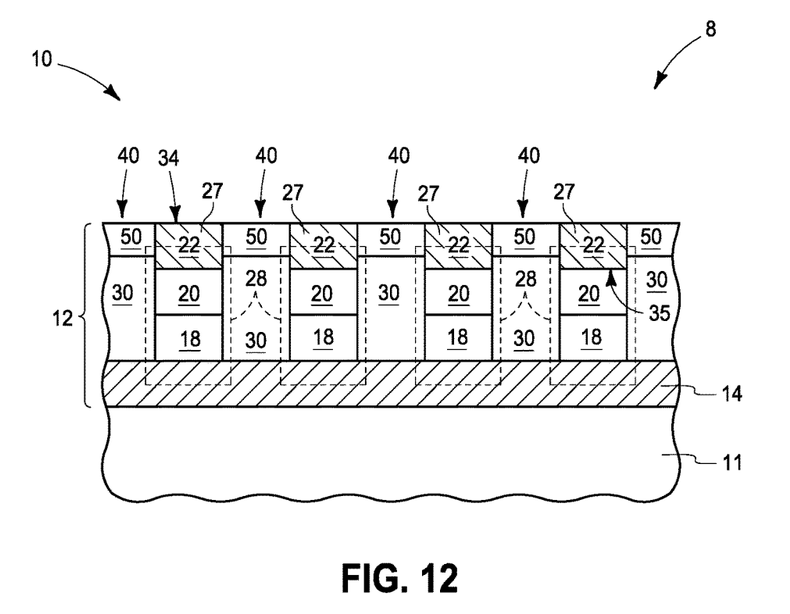
FIG. 12 is a view of the FIG. 10 substrate at a processing step subsequent to that shown by FIG. 10.
Figure 13:
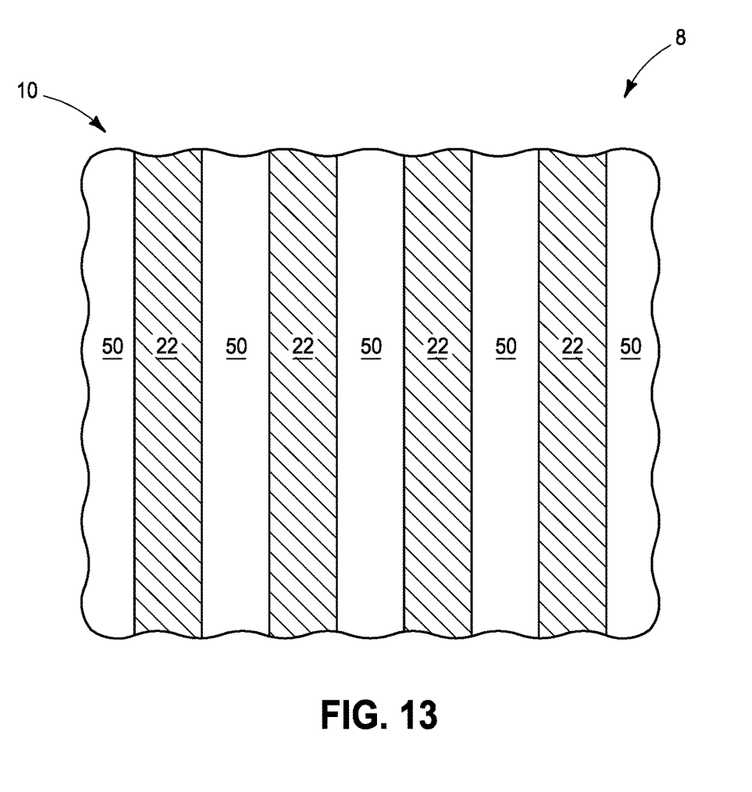
FIG. 13 is a diagrammatic top view of FIG. 12.

Referring to FIGS. 12 and 13, and in one embodiment, second insulative material 50 has been planarized back at least to elevationally outermost surfaces 34 of inner tier upper second lines 27.

An elevationally outer tier of memory cells is next formed, and which comprises spaced outer tier lower first conductive lines, spaced outer tier upper second conductive lines, and programmable material of individual outer tier memory cells elevationally between the outer tier first lines and the outer tier second lines where such cross. Example embodiments of doing so are described with respect to FIGS. 14-19.

Figure 14:
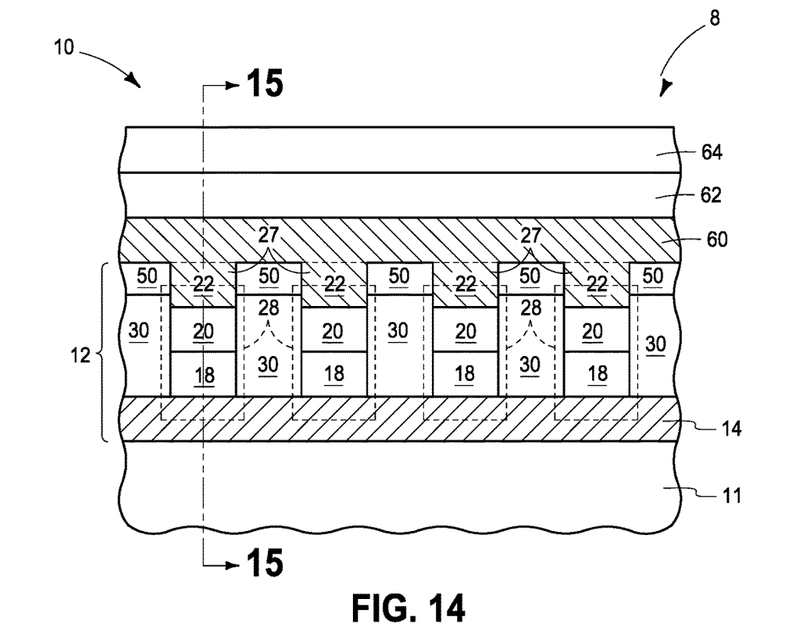
FIG. 14 is a view of the FIG. 12 substrate at a processing step subsequent to that shown by FIG. 12, and is taken through line 14-14 in FIG. 15.
Figure 15:
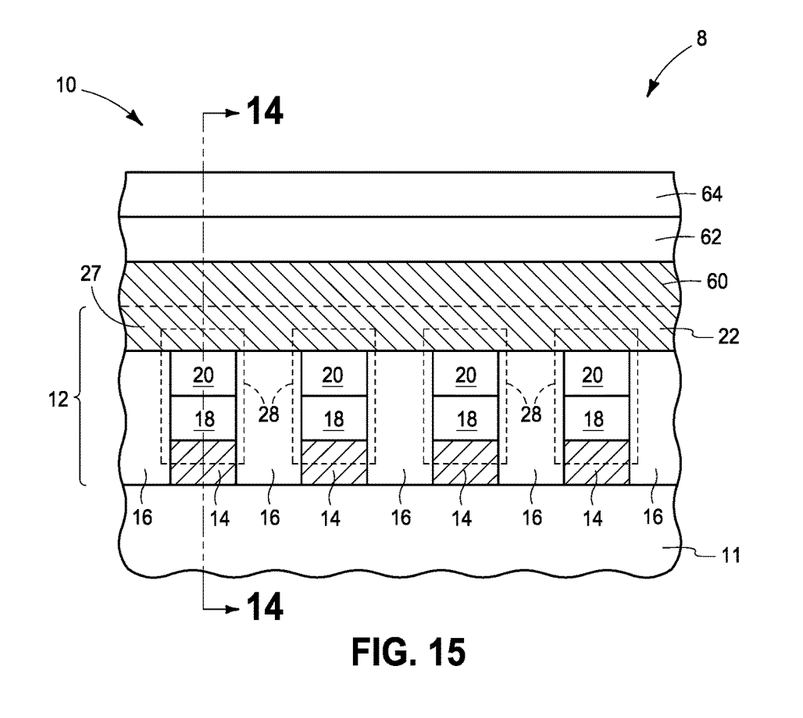
FIG. 15 is a view of the FIG. 14 substrate taken through line 15-15 in FIG. 14.

Referring to FIGS. 14 and 15, outer tier lower conductive material 60 has been formed elevationally over and in one embodiment directly electrically coupled to inner tier upper second lines 27 and over second insulative material 50 to cover all of inner tier upper second lines 27 and second insulative material 50 within array area 10. In this document, devices/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the devices/materials/components. In contrast, when devices/materials/components are referred to as being "directly electrically coupled", no intervening electronic component is between the directly electrically coupled devices/materials/components. Outer tier lower conductive material 60 may be of the same or different composition from that of either or both of the conductive material(s) of the structures designated with numerals 27 and/or 14. In one embodiment and as shown, outer tier lower conductive material 60 is of the same composition as material of the structures or materials identified with numbers 22 of 27 and is formed directly there-against as exemplified by the dashed-line interface between materials 22 and 60. In one such embodiment and as shown, individual of the inner tier upper second lines and individual of the outer tier lower first lines will be electrically shared by the inner and outer tiers.

Outer tier select device material 62 has been formed elevationally over outer tier lower conductive material 60, and may comprise the same or different material(s) as inner tier select device material 18. Outer tier programmable material 64 has been formed elevationally over and covers all of outer tier lower conductive material 60 within array area 10. Such may be the same as inner tier programmable material 20 or of different composition relative thereto.

Further, when outer tier select device material 62 is used, the position of such may be switched with that of outer tier programmable material 64.

Figure 16:
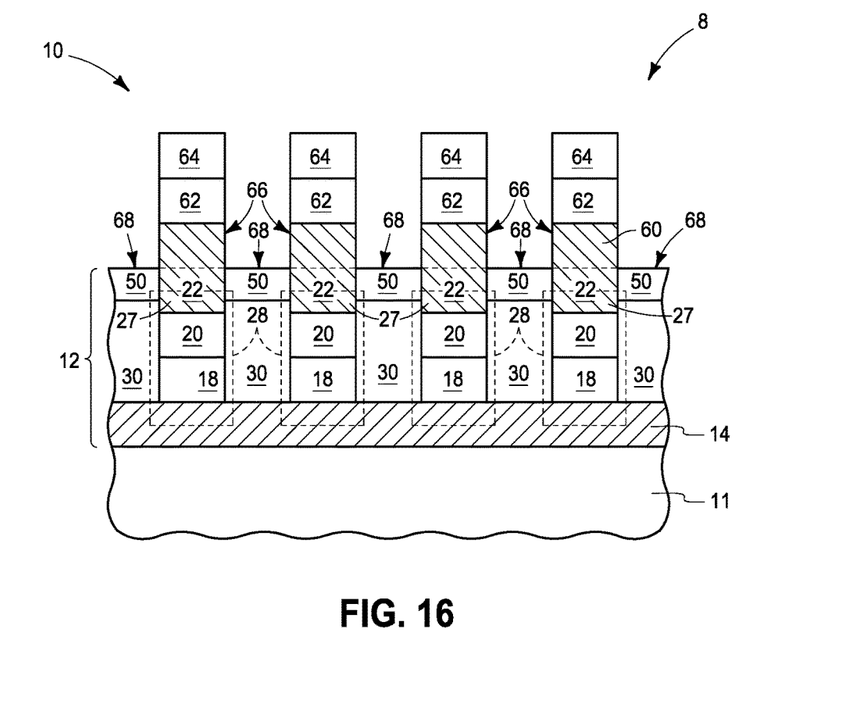
FIG. 16 is a view of the FIG. 14 substrate at a processing step subsequent to that shown by FIG. 14.

Referring to FIG. 16, etching has been conducted into and through portions of outer tier programmable material 64, outer tier select device material 62, and outer tier lower conductive material 60 to form spaced outer tier lower first conductive lines 66 that in one embodiment are individually electrically coupled to individual of inner tier upper second lines 27 and to form patterned outer tier programmable material 64 and patterned outer tier select device material 62 for the outer tier memory cells being formed. In one embodiment and as shown, such exposes elevationally outermost surfaces 68 of second insulative material 50. In one such embodiment, the FIG. 16-depicted etching does not remove all, if any, of second insulative material 50, and in one such embodiment at least the etching of outer tier lower conductive material 60 is conducted selectively relative to second insulative material 50. For example where outer tier lower conductive material 60 is elemental tungsten and second insulative material 50 is silicon dioxide or silicon nitride, an example anisotropic etching chemistry for such a selective etch of elemental tungsten is a combination of HBr, $CF_4$, and $CH_2F_2$. Regardless, at the conclusion of the etch shown by FIG. 16, materials 60, 62, and 64 may form line-stacks of such materials having spaces/trenches there-between, as shown.

Figure 17:
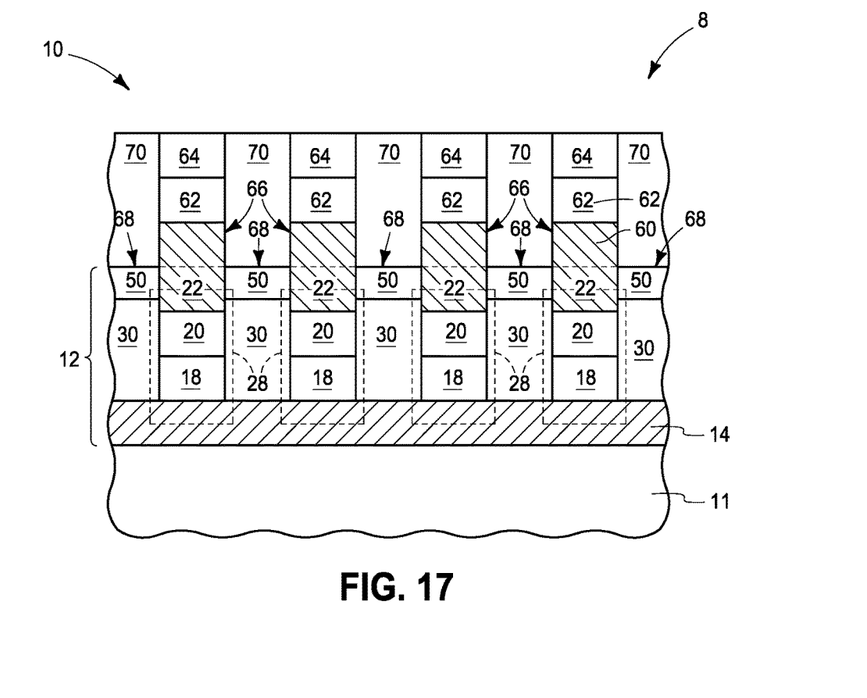
FIG. 17 is a view of the FIG. 16 substrate at a processing step subsequent to that shown by FIG. 16.

Referring to FIG. 17, third insulative material 70 has been formed between outer tier lower first lines 66 and elevationally over, and in one embodiment directly against, second insulative material 50. In one embodiment, third insulative material 70 is of different composition from that of second insulative material 50, and in one such embodiment is formed to be of the same composition as that of first insulative material 30. Third insulative material 70 may be initially deposited to overfill spaces between the depicted FIG. 16 spaced-constructions comprising materials 64, 62, and 60, followed by suitable planarizing back at least to elevationally outermost surfaces of material 64.

Figure 18:
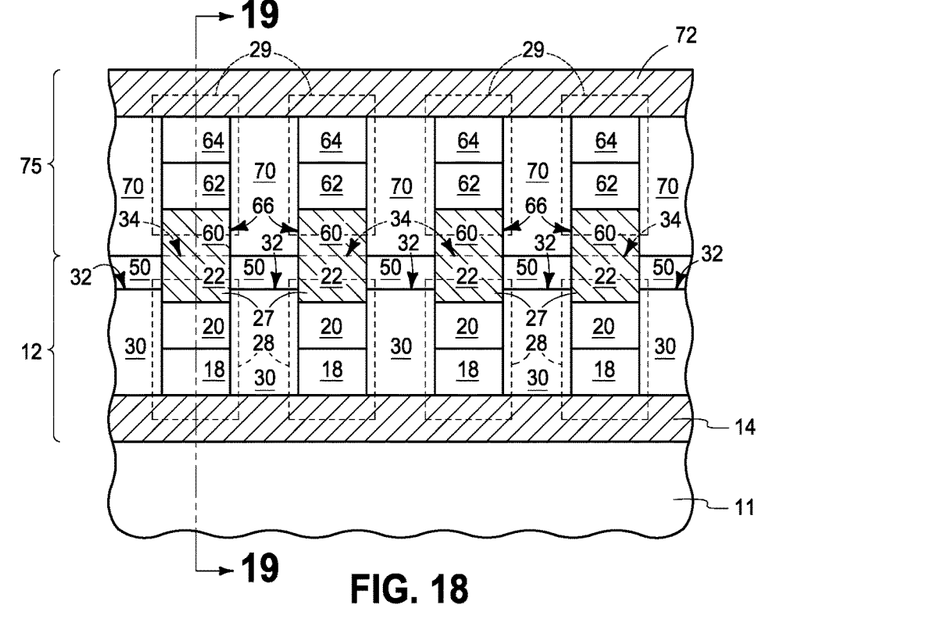
FIG. 18 is a view of the FIG. 17 substrate at a processing step subsequent to that shown by FIG. 17, and is taken through line 18-18 in FIG. 19.
Figure 19:
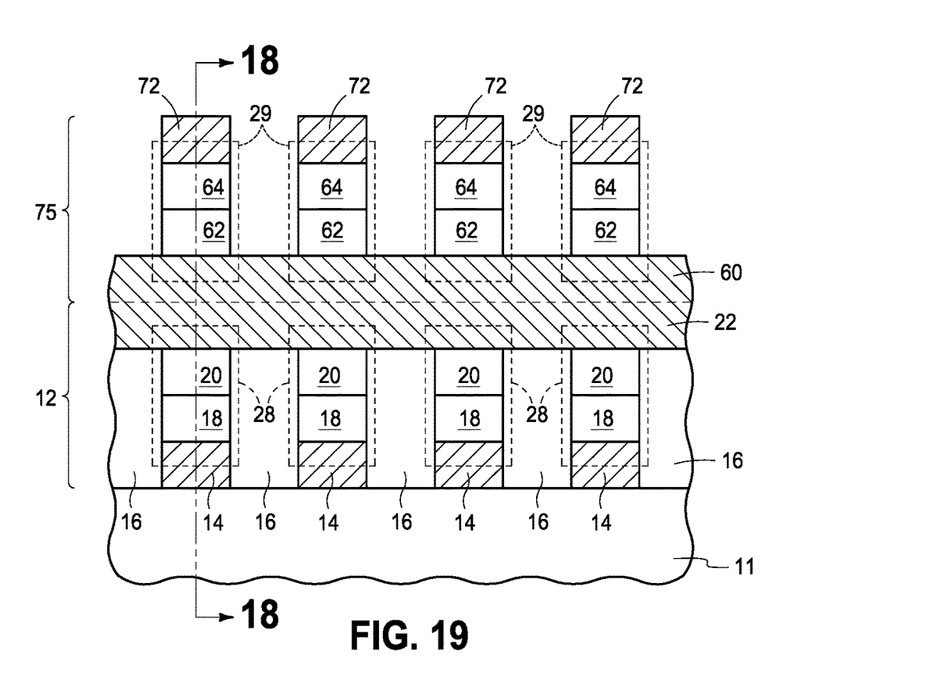
FIG. 19 is a view of the FIG. 18 substrate taken through line 19-19 in FIG. 18.

Referring to FIGS. 18 and 19, spaced outer tier upper second conductive lines 72 have been formed electrically coupled to patterned outer tier programmable material 64, thus forming an elevationally outer tier 75 of memory cells 29. Outer tier upper second conductive lines 72 may be of the same or different composition(s) as that of the material(s) of any of the structures designated with numerals 66, 27, and 14, and using any existing or yet-to-be-developed patterning technique. Materials 64 and 62 may be patterned along with and in a same, single masking step in which outer tier upper second conductive lines 72 are so patterned. Insulative material may be subsequently deposited (not shown) to fill the spaces/trenches between the constructions comprising materials of the structures designated with numerals 72, 64, and 62 in FIG. 19. Additional electrode, barrier, and/or adhesion material(s) (not shown) may be included in the FIGS. 18 and 19 construction.

The above processing is but one example method or technique of forming an elevationally outer tier 75 of memory cells 29 comprising spaced outer tier lower first conductive lines 66, spaced outer tier upper second conductive lines 72, and programmable material 64 of individual outer tier memory cells 29 elevationally between first lines 66 and outer tier upper second conductive lines 72 where such cross. Any other existing or yet-to-be-developed method(s) or technique(s) may be used.

Embodiments of the invention encompass an array of memory cells independent of method of manufacture, yet by way of example including any of the attributes shown and described above leading to production of the FIGS. 18 and 19 construction. An array of memory cells in accordance with embodiments of the invention comprise an elevationally inner tier of memory cells (e.g., tier 12 and memory cells 28) comprising spaced inner tier lower first conductive lines (e.g., 14), spaced inner tier upper second conductive lines (e.g., 27), and programmable material (e.g., inner tier programmable material 20) of individual inner tier memory cells elevationally between the inner tier first lines and the inner tier second lines where such cross. First insulative material (e.g., 30) is laterally between the inner tier second lines and has respective elevationally outermost surfaces (e.g., 32) that are lower than elevationally outermost surfaces (e.g., 34) of immediately laterally-adjacent inner tier second lines. (Even where surfaces 34 may not exist or not be distinguishable due to materials 60 and 22 being of the same composition and inner lines 27 and outer lines 66 being the same single lines, surfaces 32 are lower than elevationally outermost surfaces of material 60). Second insulative material (e.g., 50) is elevationally over the first insulative material and laterally between the inner tier second lines. The second insulative material is of different composition from that of the first insulative material. An elevationally outer tier (e.g., 75) of memory cells (e.g., 29) comprises spaced outer tier lower first conductive lines (e.g., 66), spaced outer tier upper second conductive lines (e.g., 72), and programmable material (e.g., 64) of individual outer tier memory cells (e.g., 29) elevationally between the outer tier first lines and the outer tier second lines where such cross.

In one embodiment, a third insulative material is above and directly against the second insulative material laterally between the spaced outer tier first lines and is of the same composition as the first insulative material. In one embodiment, the respective elevationally outermost surfaces of the first insulative material are elevationally outward of elevationally innermost surfaces of the inner tier second lines. In one embodiment, the first insulative material comprises at least 10% (atomic) carbon and the second insulative material comprises no more than 1% (atomic), if any, carbon. In one embodiment, the second insulative material laterally between the inner tier second lines has respective elevationally outermost surfaces that are elevationally coincident with respective elevationally outermost surfaces of the inner tier second lines (e.g., if an interface of materials 60 and 22 is distinguishable). In one such embodiment, the respective elevationally outermost surfaces of the second insulative material and the respective elevationally outermost surfaces of the inner tier second lines are everywhere planar and thereby coplanar. In one embodiment, individual of the inner tier outer second lines and individual of the outer tier inner first lines are electrically shared by the inner and outer tiers.

Any other attribute(s) or aspect(s) as shown and/or described above may be used.

CONCLUSION

In some embodiments, a method of forming an array of memory cells comprises forming an elevationally inner tier of memory cells comprising spaced inner tier lower first conductive lines, spaced inner tier upper second conductive lines, and programmable material of individual inner tier memory cells elevationally between the inner tier first lines and the inner tier second lines where such cross. First insulative material is formed laterally between the inner tier second lines to have respective elevationally outermost surfaces that are lower than elevationally outermost surfaces of immediately laterally-adjacent of the inner tier second lines. Second insulative material is formed elevationally over the first insulative material and laterally between the inner tier second lines. The second insulative material is of different composition from that of the first insulative material. An elevationally outer tier of memory cells is formed to comprise spaced outer tier lower first conductive lines, spaced outer tier upper second conductive lines, and programmable material of individual outer tier memory cells elevationally between the outer tier first lines and the outer tier second lines where such cross.

In some embodiments, a method of forming an array of memory cells comprises forming an elevationally inner tier of memory cells comprising spaced inner tier lower first conductive lines, spaced inner tier upper second conductive lines, and programmable material of individual inner tier memory cells elevationally between the inner tier first lines and the inner tier second lines where such cross. First insulative material is laterally between the inner tier second lines. Sacrificial material is formed elevationally covering over all of the inner tier second lines and the first insulative material. The sacrificial material is etched to expose the first insulative material and the inner tier second lines. The first insulative material is etched selectively relative to the inner tier second lines to form a void space atop the first insulative material laterally between immediately adjacent of the inner tier second lines. Second insulative material is formed within the void spaces to be elevationally over the first insulative material and laterally between the inner tier second lines. The second insulative material is of different composition from that of the first insulative material. An elevationally outer tier of memory cells is formed to comprise spaced outer tier lower first conductive lines, spaced outer tier upper second conductive lines, and programmable material of individual outer tier memory cells elevationally between the outer tier first lines and the outer tier second lines where such cross.

In some embodiments, a method of forming an array of memory cells comprises forming an elevationally inner tier of memory cells that comprises forming inner tier lower conductive material over a substrate within an array area of the array of memory cells being fabricated. Inner tier programmable material is formed elevationally over and covering all of the inner tier lower conductive material within the array area. The inner tier programmable material and the inner tier lower conductive material are patterned to form spaced inner tier lower first conductive lines within the array area having lines of the inner tier programmable material elevationally there-over. Inner tier upper conductive material is formed elevationally over and covering all of the lines of inner tier programmable material within the array area. Sacrificial first masking material is formed elevationally over and covering all of the inner tier upper conductive material within the array area. Patterned sacrificial second masking material is formed elevationally over the sacrificial first masking material. The sacrificial first masking material is patterned using at least the patterned second masking material as a mask. The inner tier upper conductive material and the inner tier programmable material are patterned using at least the patterned sacrificial first masking material as a mask to form spaced inner tier upper second conductive lines comprising the inner tier upper conductive material and to form programmable material of individual inner tier memory cells elevationally between the inner tier first lines and the inner tier second lines where such cross. First insulative material is formed laterally between the patterned inner tier programmable material, laterally between the inner tier second lines, and laterally between the patterned first masking material. The first insulative material has respective elevationally outermost surfaces that are higher than elevationally outermost surfaces of immediately laterally-adjacent of the inner tier second lines. Sacrificial third masking material is formed elevationally over and covering all of the patterned sacrificial first masking material and the first insulative material within the array area. The third masking material, the first masking material, and the first insulative material are etched to form a void space atop the first insulative material laterally between the inner tier second lines. Second insulative material is formed within the void spaces to be elevationally over the first insulative material and laterally between the inner tier second lines. The second insulative material is of different composition from that of the first insulative material. An elevationally outer tier of memory cells are formed, and which comprises forming outer tier lower conductive material elevationally over and electrically coupled to the inner tier second lines and elevationally over the second insulative material to cover all of the inner tier second lines and the second insulative material within the array area. Outer tier programmable material is formed elevationally over and covering all of the outer tier lower conductive material within the array area. Portions of the outer tier programmable material and the outer tier lower conductive material are etched through to the second insulative material to form spaced outer tier lower first conductive lines that are individually electrically coupled to individual of the inner tier second lines and to form patterned outer tier programmable material for the outer tier memory cells being formed. Third insulative material is formed laterally between the outer tier lower first lines. Spaced outer tier upper second conductive lines are formed electrically coupled to the patterned outer tier programmable material.

In some embodiments, an array of memory cells comprises an elevationally inner tier of memory cells comprising spaced inner tier lower first conductive lines, spaced inner tier upper second conductive lines, and programmable material of individual inner tier memory cells elevationally between the inner tier first lines and the inner tier second lines where such cross. First insulative material is laterally between the inner tier second lines having respective elevationally outermost surfaces that are lower than elevationally outermost surfaces of immediately laterally-adjacent of the inner tier second lines. Second insulative material is elevationally over the first insulative material and laterally between the inner tier second lines. The second insulative material is of different composition from that of the first insulative material. An elevationally outer tier of memory cells comprises spaced outer tier lower first conductive lines, spaced outer tier upper second conductive lines, and programmable material of individual outer tier memory cells elevationally between the outer tier first lines and the outer tier second lines where such cross.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The subject matter disclosed in U.S. patent application Ser. No. 14/998,194, filed on Dec. 23, 2015, and the invention claimed herein were made by, or on behalf of, Micron Technology, Inc. and Intel Corporation who are parties to a joint research agreement that was in effect on or before the effective filing date of the invention claimed herein. Such invention claimed herein was made as a result of activities undertaken within the scope of that joint research agreement.

The invention claimed is:

1. A method of forming an array of memory cells, comprising:

forming an elevationally inner tier of memory cells comprising spaced inner tier lower first conductive lines, spaced inner tier upper second conductive lines crossing the inner tier lower first conductive lines, and programmable material of individual inner tier memory cells elevationally between the inner tier lower first conductive lines and the inner tier upper second conductive lines at respective locations where such cross;

forming first insulative material laterally between the inner tier upper second conductive lines to have respective elevationally outermost surfaces that are lower than elevationally outermost surfaces of immediately laterally-adjacent of the inner tier upper second conductive lines;

forming second insulative material elevationally over the first insulative material and laterally between the inner tier upper second conductive lines, the second insulative material being of different composition from that of the first insulative material;

forming an elevationally outer tier of memory cells comprising spaced outer tier lower first conductive lines, spaced outer tier upper second conductive lines crossing the outer tier lower first conductive lines, and programmable material of individual outer tier memory cells elevationally between the outer tier lower first conductive lines and the outer tier upper second conductive lines at respective locations where such cross; and wherein the forming of the elevationally outermost surfaces of the first insulative material comprises:

forming the first insulative material laterally between the inner tier upper second conductive lines to initially project elevationally outward relative to the elevationally outermost surfaces of the immediately laterally-adjacent inner tier upper second conductive lines; and etching the elevationally projecting first insulative material to be everywhere elevationally inward of the elevationally outermost surfaces of the immediately laterally-adjacent inner tier upper second conductive lines.

2. The method of claim 1 comprising conducting the etching selectively relative to the inner tier upper second conductive lines.

3. The method of claim 1 wherein the forming of the outer tier of memory cells comprises etching conductive material of the outer tier lower first conductive lines to expose elevationally outermost surfaces of the second insulative material.

4. The method of claim 3 wherein all of the second insulating material or a portion of the second insulating material remains after the etching of the conductive material.

5. The method of claim 4 comprising conducting the etching of the conductive material selectively relative to the second insulative material.

6. The method of claim 1 wherein the second insulative material is formed directly against the first insulative material.

7. A method of forming an array of memory cells, comprising:

forming an elevationally inner tier of memory cells comprising spaced inner tier lower first conductive lines, spaced inner tier upper second conductive lines crossing the inner tier lower first conductive lines, and programmable material of individual inner tier memory cells elevationally between the inner tier lower first conductive lines and the inner tier upper second conductive lines at respective locations where such cross;

first insulative material being laterally between the inner tier upper second conductive lines and having an elevationally outermost surface that is higher than elevationally outermost surfaces of immediately laterally-adjacent of the inner tier upper second conductive lines;

forming sacrificial material elevationally covering over all of the inner tier upper second conductive lines and the first insulative material;

etching the sacrificial material to expose the first insulative material and the inner tier upper second conductive lines;

etching the first insulative material selectively relative to the inner tier upper second conductive lines to form a void space atop the first insulative material laterally between immediately adjacent of the inner tier upper second conductive lines, the etching of the first insulative material resulting in the first insulative material being everywhere elevationally inward of the elevationally outermost surfaces of the immediately laterally-adjacent inner tier upper second conductive lines;

forming second insulative material within the void spaces to be elevationally over the first insulative material and laterally between the inner tier upper second conductive lines, the second insulative material being of different composition from that of the first insulative material; and forming an elevationally outer tier of memory cells comprising spaced outer tier lower first conductive lines, spaced outer tier upper second conductive lines crossing the outer tier lower first conductive lines, and programmable material of individual outer tier memory cells elevationally between the outer tier lower first conductive lines and the outer tier upper second conductive lines at respective locations where such cross.

8. The method of claim 7 wherein the etchings are conducted in situ in the same etching chamber using the same chemically active etching components in each of said etchings.

9. The method of claim 8 comprising lower chamber pressure when conducting at least a majority of the etching of the first insulating material in comparison to when conducting at least a majority of the etching of the sacrificial material.

10. The method of claim 8 comprising reduced volumetric flow rate of at least one of the chemically active etching components when conducting at least a majority of the etching of the first insulating material in comparison to when conducting at least a majority of the etching of the sacrificial material.

11. The method of claim 8 wherein the etching chamber is a plasma etching chamber and the etchings each comprise plasma etching, and comprising reduced plasma-generating power when conducting at least a majority of the etching of the first insulating material in comparison to when conducting at least a majority of the etching of the sacrificial material.

12. The method of claim 11 comprising reduced volumetric flow rate of at least one of the chemically etching components when conducting at least a majority of the etching of the first insulating material in comparison to when conducting at least a majority of the etching of the sacrificial material.

13. The method of claim 12 comprising lower chamber pressure when conducting at least a majority of the etching of the first insulating material in comparison to when conducting at least a majority of the etching of the sacrificial material.

14. The method of claim 8 wherein,
the sacrificial material comprises silicon nitride and the first insulative material comprises silicon, oxygen, and carbon;
at least a majority of the etching of the sacrificial material comprises:
plasma etching using a first source power, a first chamber pressure, a first flow rate of a hydrogen halide, a first flow rate of a fluorocarbon, and a first flow rate of a hydrofluorocarbon; and
at least a majority of the etching of the first insulative material comprises:
plasma etching using a second source power, a second chamber pressure, the first flow rate of the hydrogen halide, a second flow rate of the fluorocarbon, and the first flow rate of the hydrofluorocarbon; the second source power being less than the first source power, the second chamber pressure being less than the first chamber pressure, the second flow rate of the fluorocarbon being less than the first flow rate of the fluorocarbon.

15. The method of claim 7 comprising forming the sacrificial material in two separate time-spaced deposition steps.

16. The method of claim 15 comprising forming the sacrificial material in each of the two separate deposition steps to be of the same composition.

17. A method of forming an array of memory cells, comprising:
forming an elevationally inner tier of memory cells, comprising:
forming inner tier lower conductive material over a substrate within an array area of the array of memory cells being fabricated;
forming inner tier programmable material elevationally over and covering all of the inner tier lower conductive material within the array area;
patterning the inner tier programmable material and the inner tier lower conductive material to form spaced inner tier lower first conductive lines within the array area having lines of the inner tier programmable material elevationally there-over;
forming inner tier upper conductive material elevationally over and covering all of the lines of inner tier programmable material within the array area;
forming sacrificial first masking material elevationally over and covering all of the inner tier upper conductive material within the array area;
forming patterned sacrificial second masking material elevationally over the sacrificial first masking material;
patterning the sacrificial first masking material using at least the patterned second masking material as a mask; and
patterning the inner tier upper conductive material and the inner tier programmable material using at least the patterned sacrificial first masking material as a mask to form spaced inner tier upper second conductive lines crossing the inner tier lower first conductive lines and comprising the inner tier upper conductive material and to form programmable material of individual inner tier memory cells elevationally between the inner tier lower first conductive lines and the inner tier upper second conductive lines at respective locations where such cross;
forming first insulative material laterally between the patterned inner tier programmable material, laterally between the inner tier upper second conductive lines, and laterally between the patterned sacrificial first masking material;
the first insulative material having respective elevationally outermost surfaces that are higher than elevationally outermost surfaces of immediately laterally-adjacent of the inner tier upper second conductive lines;
forming sacrificial third masking material elevationally over and covering all of the patterned sacrificial first masking material and the first insulative material within the array area;
etching the third masking material, the sacrificial first masking material, and the first insulative material to form a void space atop the first insulative material laterally between the inner tier upper second conductive lines;
forming second insulative material within the void spaces to be elevationally over the first insulative material and laterally between the inner tier upper second conductive lines, the second insulative material being of different composition from that of the first insulative material; and
forming an elevationally outer tier of memory cells, comprising:
forming outer tier lower conductive material elevationally over and electrically coupled to the inner tier upper second conductive lines and elevationally over the second insulative material to cover all of the inner tier upper second conductive lines and the second insulative material within the array area;
forming outer tier programmable material elevationally over and covering all of the outer tier lower conductive material within the array area;
etching through portions of the outer tier programmable material and the outer tier lower conductive material to the second insulative material to form spaced outer tier lower first conductive lines that are individually electrically coupled to individual of the inner tier upper second conductive lines and to form patterned outer tier programmable material for the outer tier memory cells being formed;
forming third insulative material laterally between the outer tier lower first conductive lines; and
forming spaced outer tier upper second conductive lines electrically coupled to the patterned outer tier programmable material.

18. The method of claim 17 comprising conducting the etching of the first insulative material to form the void spaces selectively relative to the inner tier upper second conductive lines.

19. The method of claim 17 comprising conducting at least the etching of the outer tier lower conductive material selectively relative to the second insulative material.

20. The method of claim 17 wherein the third insulative material is formed to be of the same composition as the first insulative material.

* * * * *